United States Patent [19]
Velthaus et al.

[11] Patent Number: 5,505,986
[45] Date of Patent: Apr. 9, 1996

[54] MULTI-SOURCE REACTIVE DEPOSITION PROCESS FOR THE PREPARATION OF BLUE LIGHT EMITTING PHOSPHOR LAYERS FOR AC TFEL DEVICES

[75] Inventors: Karl-Otto Velthaus, Göppingen; Reiner H. Mauch, Stuttgart; T. Achim Oberacker, Gärtringen; Hans-Werner Schock, Stuttgart, all of Germany; Sey-Shing Sun, Beaverton, Oreg.; Randall C. Wentross, Portland, Oreg.; Richard T. Tuenge, Hillsboro, Oreg.

[73] Assignee: Planar Systems, Inc., Beaverton, Oreg.

[21] Appl. No.: 195,999

[22] Filed: Feb. 14, 1994

[51] Int. Cl.$^6$ ....................................................... B05D 5/06
[52] U.S. Cl. ......................... 427/66; 427/69; 427/248.1; 427/255.2
[58] Field of Search ........................... 427/69, 66, 248.1, 427/255.2

[56] References Cited

PUBLICATIONS

Preparation of Eu–and Eu–Cl$_3$–Doped CaS Based Thin Film Electroluminescent Devices, from Acta Polytechnia Scandinavica, Applied Physics Series 170 (1990), p. 227.

Multi–Source Deposition Method for ZnS and SrS Thin–Film Electroluminescent Devices, from Proceeding of 4th Int. Works on Electroluminescence 1988; published in Springer Proceedings in Physics, vol. 38 "Electroluminescence," p. 180, 1989.

*Primary Examiner*—Janyce Bell
*Attorney, Agent, or Firm*—Chernoff, Vilhauer, McClung & Stenzel

[57] ABSTRACT

A multi-source reactive deposition process for preparing a phosphor layer for an AC TFEL device having the chemical formula $M^{II}M^{III}_2X_4$:RE, where $M^{II}$ is a group II metal taken from the group magnesium, calcium, strontium and barium, $M^{III}$ is a group III metal taken from the group aluminum, gallium and indium, X is taken from the group sulfur and selenium, and RE comprises a rare earth activator dopant taken from the group cerium and europium is disclosed. The phosphor film is formed in crystalline form on a substrate heated to a temperature between 400° and 800° C. by depositing more than one deposition source chemical where at least one of the deposition source chemicals of the group II metal or the group III metal is a compound.

7 Claims, 2 Drawing Sheets

MULTI-SOURCE REACTIVE DEPOSITION PROCESS FOR THE PREPARATION OF BLUE LIGHT EMITTING PHOSPHOR LAYERS FOR AC TFEL DEVICES

BACKGROUND OF THE INVENTION

This invention relates to a process for preparing electroluminescent thin films, and more particularly to a multi-source reactive deposition process for preparing a blue light emitting thin phosphor film.

Blue light emitting phosphors suitable for use in full-color thin film electroluminescent flat panel displays have previously been identified. U.S. patent application Ser. No. 07/668,201 to Sun et al. filed Mar. 12, 1991, now U.S. Pat. No. 5,309,070 discloses a blue light emitting phosphor film, $CaGa_2S_4$:Ce, prepared by a sputter-deposition technique. However, the deposited film is an amorphous film and therefore a post-deposition high temperature thermal anneal is required to crystalize the deposited film. Only a costly high temperature glass-ceramic substrate can maintain dimensional stability under the demanding annealing conditions. Thus, the sputter-deposition technique is not compatible with a less expensive borosilicate glass substrate, the conventional flat panel display substrate.

The crystalline structure of a deposited film is affected by the substrate temperature, and a relatively high substrate temperature is desirable. However, using a higher substrate temperature results in a film deficient in certain elements when the film is deposited from a single source. Thus, $M^{II}Ga_2S_4$:Ce films formed by sputter deposition using a single target at substrate temperatures higher than about 300° C. are deficient in gallium and sulfur.

A low temperature evaporation technique for the preparation of either a Eu- or $EuCl_3$-doped CaS phosphor is disclosed by Mauch et al. in "Preparation of Eu- and $EuCl_3$-Doped Thin Film CaS Based Electroluminescent Devices," *Acta Polytechnica Scandinavica,* Applied Physics Series 170, 227 (1990). The doped phosphor layer is deposited by coevaporation of calcium, sulfur and dopants from graphite based effusion sources. T. Nire et al., in "Multi-Source Deposition Methods for ZnS and SrS Thin-Film Electroluminescent Devices," Electroluminescence, Springer Proceedings in Physics, Vol. 38, 180 (1989), disclose a multi-source deposition method for the deposition of the blue light emitting phosphor SrS:Ce. The phosphor layer, SrS:Ce, was fabricated by using three sources: Sr, S, Ce or Sr, S, $CeCl_3$; and four sources: Sr, S, Ce, KCl or Sr, S, Ce, $K_2S$. However, an attempt to deposit a film of $SrGa_2S_4$:Ce in a multi-source reactive deposition process using Sr, Ga, S and $CeCl_3$ sources was unsuccessful because excess gallium segregates into droplets on the film which results in poor reliability of the finished electroluminescent device.

What is still needed is an improved process for the preparation of a crystalline blue light emitting phosphor layer for an AC TFEL device on conventional flat panel borosilicate glass substrates.

SUMMARY OF THE INVENTION

The problems associated with the preparation of a blue light emitting phosphor are addressed in the present invention by providing a multi-source reactive deposition process for preparing a phosphor layer for an AC TFEL device having the chemical formula $M^{II}M^{III}_2X_4$:RE, where $M^{II}$ is a group II metal taken from the group magnesium, calcium, strontium and barium, $M^{III}$ is a group III metal taken from the group aluminum, gallium and indium, X is taken from the group sulfur and selenium, and RE comprises a rare earth activator dopant taken from the group cerium and europium. The phosphor film is formed in crystalline form on a substrate heated to a temperature between 400° and 800° C. by depositing more than one deposition source chemical where at least one of the deposition source chemicals of the group II metal or the group III metal is a compound.

Thus, in this method a thin phosphor film with high crystallinity is formed on the substrate, totally eliminating the requirement of a post-deposition thermal anneal and thereby allowing the use of a conventional borosilicate glass substrate. Furthermore, by providing one of the source chemicals of the group II metal or the group III metal as a compound, a stoichiometric film is formed which is completely free of droplets of excess group II or group III metals. In addition, when one of the source chemicals of the group II metal or group III metal is a compound, a stoichiometric film which is not deficient in any element can be prepared at an elevated substrate temperature by controlling the flux of each of the constituent elements or compounds.

The foregoing and other objectives, features, and advantages of the invention will be more readily understood upon consideration of the following detailed description of the invention, taken in conjunction with the accompanying drawings.

DETAILED DESCRIPTION OF THE PREFERRED EMBODIMENT

Figure 1:
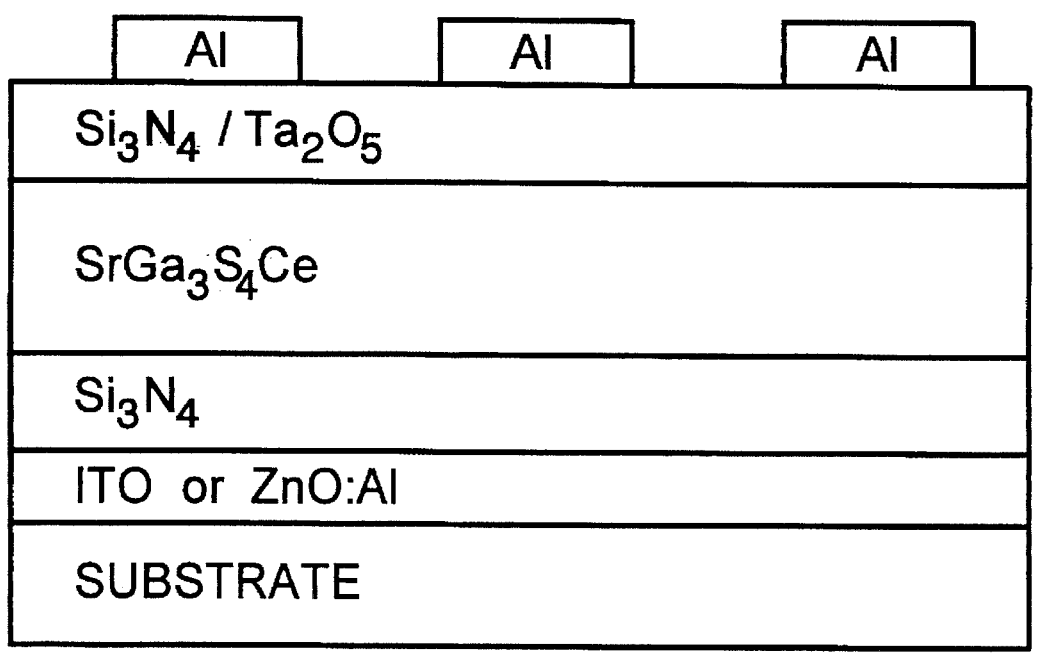
FIG. 1 is a sectional side view of an AC TFEL device showing a blue light emitting phosphor layer prepared by the method of the present invention.

Referring to FIG. 1, a TFEL panel includes a glass substrate which supports, for example, a transparent indium tin oxide (ITO) electrode layer as shown, or a ZnO:Al electrode layer. Deposited on top of the ITO electrode layer is a layer of silicon nitride ($Si_3N_4$) or some other suitable insulating dielectric layer such as silicon oxinitride (SION), aluminum-titanium oxide (ATO), or barium-tantalum oxide (BTO)- Although not shown, a nucleation layer or barrier layer may next be deposited on the dielectric layer before deposition of the phosphor layer, $SrGa_2S_4$:Ce. A second dielectric layer may be deposited on top of the phosphor layer before a top aluminum electrode is deposited.

As shown in FIG. 1, it is desirable to use a silicon nitride insulator in the TFEL device if strontium metal is the source for the strontium reactant because the strontium metal may react with an oxide insulating layer, which results in discolored films and films with poor luminescence characteristics. Other non-oxide insulators such as AlN, GaN or BN are not expected to react with strontium vapor and may also provide good electroluminescence characteristics. The nitride layers can alternatively be used as barrier layers between the phosphor layer and the insulating oxide dielectrics.

Figure 2:
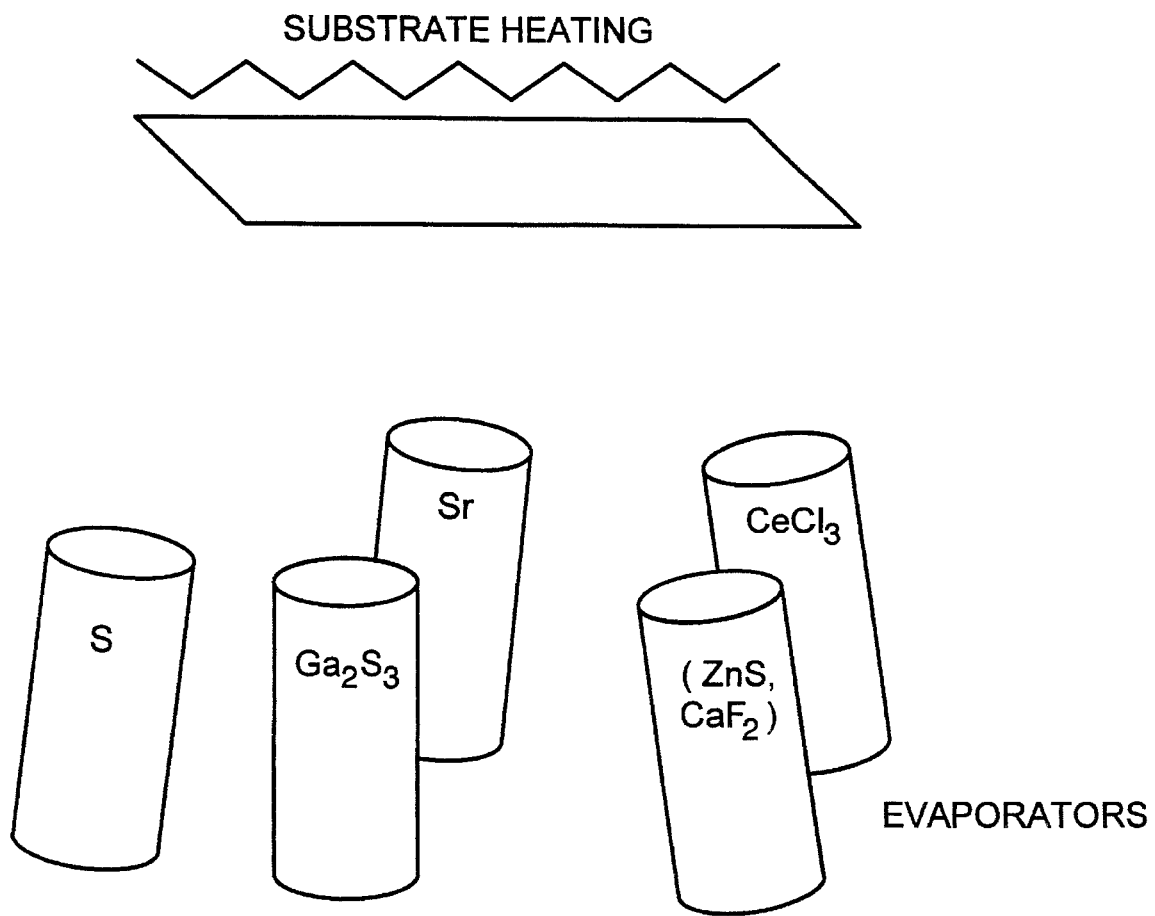
FIG. 2 is a schematic view of a multi-source deposition system employed in the present invention.

FIG. 2 shows a schematic diagram of a multisource reactive deposition system which may be used for preparing stoichiometric $M^{II}M^{III}_2X_4$:RE phosphor films where $M^{II}$ is a group II metal selected from magnesium, calcium, strontium and barium, $M^{III}$ is a group III metal selected from aluminum, gallium and indium, X is sulfur or selenium, and RE comprises $Ce^{3+}$ or $Eu^{2+}$. As illustrated in FIG. 2, the substrate and deposition source chemicals are placed in a vacuum chamber, together with heaters for heating the substrate and the deposition source chemicals. The source chemicals are placed, for example, in effusion sources and thus can be coevaporated. The temperature of each effusion source is individually controlled and thus the flux of each deposition source chemical is individually controlled. For example, the rate of evaporation or the flux of an element or compound from an effusion source can be varied by varying the temperature of the effusion source.

The temperature of the substrate is separately controlled and may be varied as desired, for example, to affect the crystalline structure of the deposited film, from about 400° C. to about 800° C., or to the temperature at which the substrate softens or deforms. Since the temperature of the substrate and each source chemical is separately controlled, optimum conditions for deposition of a stoichiometric crystalline film are provided. When the $M^{II}$ or $M^{III}$ source is a compound, excess $M^{III}$ does not form droplets on the film, nor is the resulting film deficient in any element.

The vacuum chamber is evacuated, and substrate and sources are each heated to the respective selected temperature. The phosphor layer, for example, $SrGa_2S_4$:Ce, is deposited by coevaporation of the deposition source chemicals Sr, S, $Ga_2S_3$, and $CeCl_3$, from effusion sources such as Knudsen cells. As shown schematically in FIG. 2, it may be desirable to include a coactivator dopant such as Na, K, Zn, Cl or F, for example, to charge compensate for the +3 valence of the Ce activator dopant. It may also be desirable to deposit the phosphor layer using an excess of sulfur in order to control the morphology and crystallinity of the phosphor film layer.

The multi-source reactive deposition system permits the control of the individual temperature, and thus of the flux, of each of the deposition source chemicals, which is necessary in order to prepare stoichiometric phosphor films at elevated substrate temperatures. Other multiple source deposition methods that can provide a controlled flux of the constituents of the phosphor film, such as multisource sputtering and chemical vapor deposition processes are also acceptable deposition methods.

Other group III metal sulfide and selenide sources such as $In_2S_3$, $In_2Se_3$, $Ga_2Se_3$, $Al_2S_3$ and $Al_2Se_3$ may be used in place of $Ga_2S_3$ to deposit $SrIn_2S_4$:Ce, $SrIn_2Se_4$:Ce, $SrGa_2Se_4$:Ce, $SrAl_2S_4$:Ce, and $SrAl_2Se_4$:Ce phosphor films respectively. Other group II metal sources such as Ca and Ba may be used instead of Sr to deposit the corresponding alkaline earth thiogallate, thioaluminate or thioindate phosphor films. Alternatively, group II metal sulfide or selenide sources, such as CaS, SrS, BaS, CaSe, SrSe, BaSe may be used instead of the elemental metal sources. Europium doping of these films can produce either green or blue emissions depending on the crystal field effect of the host lattice.

To further illustrate the invention the following example is given.

Preparation of a Strontium Thiogallate:Cerium Film

Deposition source chemicals of strontium metal, sulfur, $CeCl_3$, and $Ga_2S_3$ are loaded under an inert gas atmosphere into respective Knudsen cells and weighed. The loaded Knudsen cells are transferred to a vacuum chamber which contains the glass substrates on which the phosphor films will be deposited and resistance or lamp heaters for heating the sources and the substrates.

The chamber is evacuated to a pressure of $1\times10^{-7}$ mbar. The substrate is heated to a temperature between 600° and 650° C. The temperature is measured with a thermocouple in contact with the substrate.

The Knudsen cell sources are heated to the following temperatures in approximately 10 minutes.

sulfur:260° C.

strontium:620° C.

$CeCl_3$: 740° C.

$Ga_2S_3$: 910° C.

The temperatures are measured using thermocouples in contact with each Knudsen cell. When the temperatures of all sources have stabilized for about 15 minutes at the respective desired temperatures, the shutters are opened. The chamber pressure during the deposition is $5\times10^{-6}$ to $5\times10^{-5}$ mbar.

The shutters are closed after 30 minutes of evaporation at the described conditions. The substrate and source heaters are turned off. When the substrate and source temperatures are ≦50° C., the vacuum chamber is vented to atmospheric pressure and opened.

A strontium thiogallate:cerium film prepared as described above demonstrates an $L_{40}$ luminance of 10 cd/m$^2$ and an $L_{80}$ luminance of 20 cd/m$^2$ at a drive frequency of 1 kHz. The CIE coordinates of the blue light emitting $SrGa_2S_4$:Ce EL device are x=0.14, y=0.13.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A process for preparing a phosphor layer for an AC TFEL device comprising a transparent substrate, said phosphor layer having the chemical formula:

$M^{II}M^{III}_2X_4$:RE where $M^{II}$ is a group II metal taken from the group magnesium, calcium, strontium and barium; $M^{III}$ is a group III metal taken from the group aluminum, gallium and indium; X is taken from the group selenium and sulfur; and RE comprises a rare earth activator dopant taken from the group cerium and europium, said process comprising the steps of heating said substrate to a temperature between 400° and 800° C. and forming said phosphor layer in crystalline form on said heated substrate by depositing from vapor more than one deposition source chemical, wherein at least one of said deposition source chemicals of said group II metal or said group III metal is a compound, said deposition source chemicals comprising all of the elements of said phosphor layer.

2. The process of claim 1 wherein said deposition source chemical of said $M^{II}$ is $M^{II}X$.

3. The process of claim 1 wherein said deposition source chemical of said $M^{III}$ is $M^{III}_2X_3$.

4. The process of claim 2 or 3 wherein an effusion cell is used for coevaporation of each said deposition source chemical.

5. The process of claim 4 wherein each said effusion cell is a Knudsen cell.

6. The process of claim 4 wherein each said Knudsen cell defines an orifice and includes a shutter for selectively opening and closing said orifice, each said Knudsen cell is heated to a deposition source chemical vaporizing temperature and thereafter said shutter is opened for a vapor deposition time.

7. A process for preparing a phosphor layer for an AC TFEL device comprising a transparent substrate, said phosphor layer having the chemical formula:

$M^{II}M^{III}_2X_4$:RE where $M^{II}$ is a group II metal taken from the group magnesium, calcium, strontium and barium; $M^{III}$ is a group III metal taken from the group aluminum, gallium and indium; X is taken from the group selenium and sulfur; and RE comprises a rare earth activator dopant taken from the group cerium and europium, said process comprising the steps of:

(a) placing each one of a plurality of deposition source chemicals comprising all of the elements of said phosphor layer in a respective effusion source having a selectively openable and closable shutter under an inert gas atmosphere and closing said shutter, wherein at least one of said deposition source chemicals of said group II metal or said group III metal is a compound;

(b) thereafter placing said substrate and each said effusion source into a vacuum chamber and evacuating said vacuum chamber;

(c) thereafter heating said substrate and each said effusion source to a respective elevated temperature to form a heated substrate and a chemical vapor in each said effusion source;

(d) thereafter opening the shutter of each said effusion source for a vapor deposition time to allow said chemical vapor to form a phosphor layer on said heated substrate, and after said vapor deposition time, closing said shutter; and (e) thereafter cooling said substrate and venting said chamber to atmospheric pressure.

* * * * *